(12) United States Patent
Pawlowski

(10) Patent No.: US 11,158,393 B2
(45) Date of Patent: *Oct. 26, 2021

(54) INTRA-CODE WORD WEAR LEVELING TECHNIQUES

(71) Applicant: Micron Technology, Inc., Boise, ID (US)

(72) Inventor: Joseph T. Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/066,399

(22) Filed: Oct. 8, 2020

(65) Prior Publication Data

US 2021/0090669 A1    Mar. 25, 2021

Related U.S. Application Data

(63) Continuation of application No. 16/553,977, filed on Aug. 28, 2019, now Pat. No. 10,825,535.

(51) Int. Cl.
*G11C 7/00* (2006.01)
*G11C 16/34* (2006.01)
(Continued)

(52) U.S. Cl.
CPC ........ *G11C 16/349* (2013.01); *G06F 12/0246* (2013.01); *G11C 11/4063* (2013.01);
(Continued)

(58) Field of Classification Search
CPC .............. G11C 16/349; G11C 11/4063; G06F 12/0246; G06F 2212/7201; G06F 2212/7211
See application file for complete search history.

(56) References Cited

U.S. PATENT DOCUMENTS 9,158,672 B1    10/2015  Zheng et al.
9,975,359 B2 *  5/2018   Itoh .................... G03G 15/6508
(Continued)

OTHER PUBLICATIONS

ISA/KR, International Search Report and Written Opinion of the International Searching Authority, Int'l Appl. No. OCT/US2020/046996, dated Nov. 25, 2020, Korean Intellectual Property Office, Seo-gu, Daejeon, Republic of Korea, 9 pgs.

*Primary Examiner* — Pho M Luu
(74) *Attorney, Agent, or Firm* — Holland & Hart LLP

(57) ABSTRACT

Methods, systems, and devices for spare substitution in a memory system are described. Aspects include a memory device identifying a rotation index that indicates a first assignment of logical channel to physical channels for code words stored in a memory medium. The memory device may use a pointer to indicate one or more code word addresses that are to be rotated and update a value of the pointer associated with a range for the rotation index based on a condition being satisfied. The memory device may rotate a first code word according to a first assignment of the rotation index, where the rotating may occur at an address of the memory medium corresponding to the updated value of the pointer. Additionally, the memory device may execute access operations on the memory medium that include multiplexing multiple logical channels to multiple physical channels based on the rotation index and the pointer.

20 Claims, 8 Drawing Sheets

(51) Int. Cl.
   *G11C 11/4063*   (2006.01)
   *G06F 12/02*     (2006.01)
(52) U.S. Cl.
   CPC ............ *G06F 2212/7201* (2013.01); *G06F 2212/7211* (2013.01)

(56) References Cited

U.S. PATENT DOCUMENTS

| | | | |
|---|---|---|---|
| 10,613,943 B2 * | 4/2020 | Guo | G06F 11/1441 |
| 10,825,535 B1 * | 11/2020 | Pawlowski | G11C 16/08 |
| 2009/0240873 A1 | 9/2009 | Yu et al. | |
| 2011/0209028 A1 | 8/2011 | Post et al. | |
| 2015/0261797 A1 | 9/2015 | Alcantara et al. | |
| 2019/0147923 A1 * | 5/2019 | Pawlowski | H04L 47/10 |
| | | | 711/149 |
| 2019/0221273 A1 | 7/2019 | Parkinson et al. | |
| 2020/0089433 A1 * | 3/2020 | Koyama | G06F 3/0659 |

\* cited by examiner

INTRA-CODE WORD WEAR LEVELING TECHNIQUES

CROSS REFERENCE

The present Application for Patent is a continuation of U.S. patent application Ser. No. 16/553,977, by Pawlowski, entitled "INTRA-CODE WORD WEAR LEVELING TECHNIQUES," filed Aug. 28, 2019 and issued on Nov. 3, 2020 as U.S. Pat. No. 10,825,535, assigned to the assignee hereof, and is expressly incorporated by reference in its entirety herein.

BACKGROUND

The following relates generally to operating a memory subsystem or system and more specifically to intra-code word wear leveling techniques in a memory system.

A computing system may include a memory subsystem or system including various kinds of memory devices and controllers that are coupled with one or more buses to manage information in numerous electronic devices such as computers, wireless communication devices, internet of things, cameras, digital displays, and the like. Memory devices are widely used to store information in such electronic devices. Information is stored by programing different states of a memory device. For example, binary devices have two states, often denoted by a logic "1" or a logic "0." In other systems, more than two states may be stored in memory devices. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read-only memory (ROM), dynamic RAM (DRAM), synchronous DRAM (SDRAM), ferroelectric RAM (FeRAM), magnetic RAM (MRAM), resistive RAM (RRAM), flash memory, not-AND (NAND) memory, phase change memory (PCM), and others. Memory devices may be volatile or non-volatile. Non-volatile memory cells may maintain their logic states for extended periods of time even in the absence of an external power source. Volatile memory cells (e.g., DRAM cells) may lose their stored state over time unless they are periodically refreshed by an external power source.

Improving a computing system may include enhancing a memory system's performance, such as reducing power consumption, increasing memory capacity and reliability, improving read/write speeds, providing non-volatility by use of persistent memory media, or reducing manufacturing costs at a certain performance point, among other metrics.

DETAILED DESCRIPTION

Figure 1:
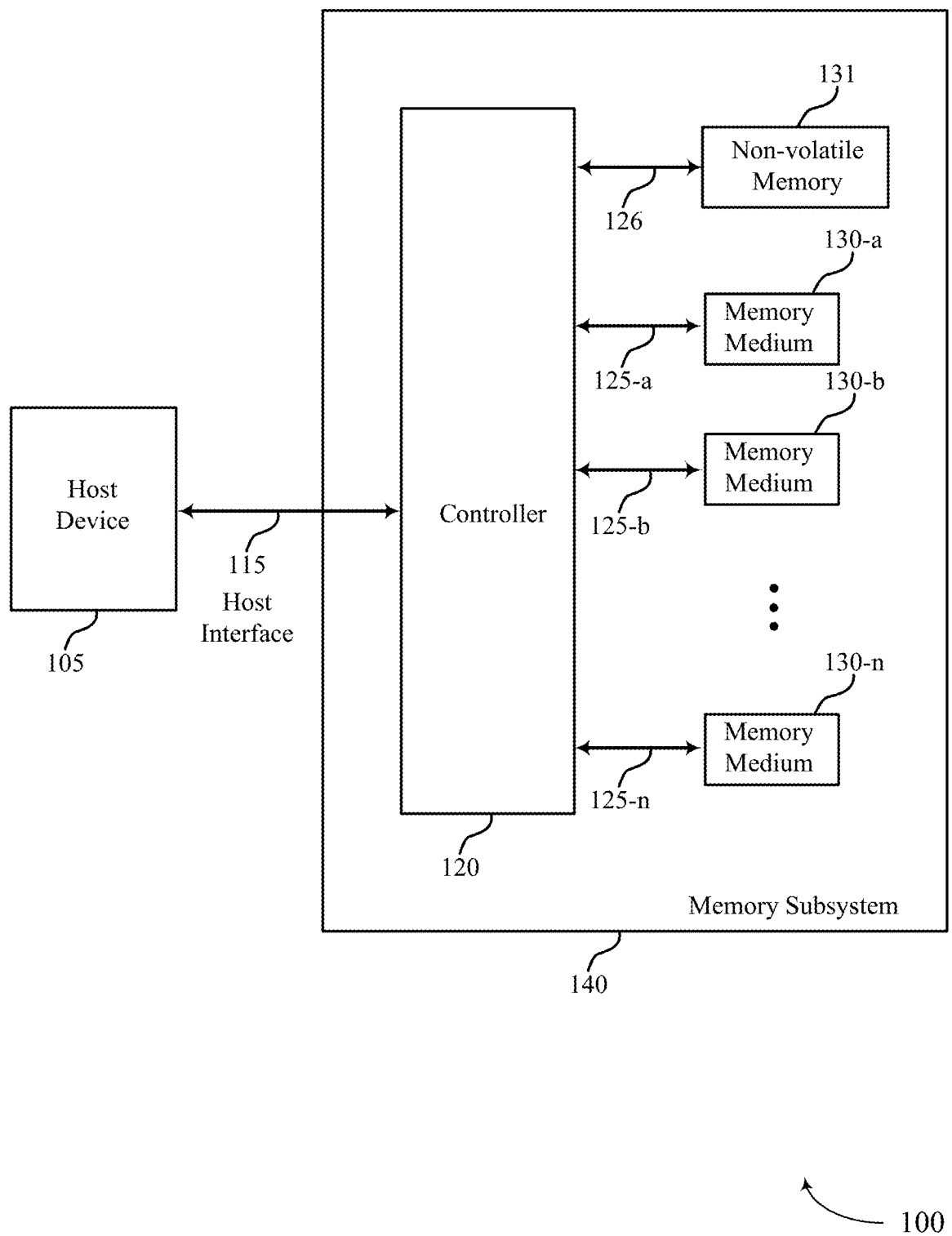
FIG. 1 illustrates an example of a computing system that supports intra-code word wear leveling techniques in accordance with aspects disclosed herein.

Some types of memory may have limits regarding a quantity of access operations (e.g., write operations and/or read operations) that may be performed on each cell without degradation in memory performance. In addition, certain regions of memory may be more frequently accessed than other regions of memory, leading some regions of memory to degrade or wear-out faster than other regions.

Memory cells of a memory device may wear-out or stop reliably storing a memory state when the quantity of access operations (e.g., reads, writes, etc.) to those cells surpasses a wear threshold. In some cases, one or more memory cells may be subjected to a higher concentration of access operations, for example, due to normal operations of a memory device or a malicious attack. Accordingly, some memory cells of a memory device may wear-out before other, less accessed, memory cells. As such, logic states stored at those cells may become corrupted, or if identified, a memory device may need to dedicate resources to correcting errors or storing data associated with worn out memory cells.

Memory devices may include one or more logical structures for associating logical memory addresses with physical memory locations. In some cases, when data is stored a memory device may have a mechanism that encodes data such that the memory device can identify and correct errors in the data. Data groups may be encoded by adding a quantity of redundant bits to correct for errors. The redundantly encoded data may be referred to as a code word. A code word may be associated with logic channels of a memory device and mapped to physical channels using a logical to physical channel mapping. For example, a code word may include data groups that are stored according to channels (e.g., eleven logical channels where each channel represents data stored to a single die for a given code word). In some cases, certain bits within the code word may see more write cycles than other bits in the code word, which may lead to premature wear of some physical bit locations that are associated with those logic channels.

According to various aspects, a logical to physical channel mapping may be changed (e.g., rotated) to move the physical location of bits associated with a logic channel of a code word. Accordingly, portions of a code word that are prone to more frequent accesses (e.g., changes in bit values) may be associated with different physical memory locations over time leading to wear leveling of physical memory locations associated with the logical code word channels.

A memory device may include a rotation index that indicates assignments of logical channels to physical channels for a code word. Multiple rotation indices may be associated with different logical to physical channel assignments for a memory medium. For example, the memory device may be initiated or initially store data according to a first rotation index that is associated with a first assignment of logical channels to physical channels. The memory device may also include a pointer associated with the rotation index, which indicates a division between code words whose logical channels are rotated according to the first rotation index and code words whose logical channels are rotated according to a second (e.g., next) rotation index. The pointer may progress to indicate that a next code word is to be rotated based on a triggering condition (e.g., a time condition). The memory device may rotate the next code word according to a difference between the first assignment and a second assignment of logical channels to physical channels for the second rotation index. For example, the memory device may read the next code word according to the first assignment and write the next code word back according to the second assignment. In this regard, specific logical structures within the code word are written to new or different physical locations according to the first assignment. In some cases, after the memory device has rotated each code word within a memory region, the memory device may initiate a second rotation of the code words using a third assignment of logical channels to physical channels associated with a third rotation index. Thus, logical channels of the code word may be iteratively updated to different physical channel locations.

The memory device may execute access operations on rotated channels of the memory medium by multiplexing the logical channels to the physical channels using the rotation index and pointer. In this regard, the memory device may track or associate a memory address (e.g., logical address) associated with an access operation to a current physical location of the logical code word structure. Although described in the context of rotation, other types of rearranging of the channels may be performed. That is, the rotation index may be a mapping index, and different mapping indices may correspond to different mappings of logical channels to physical channels, where consecutive mapping indices may not be associated with rotated mappings.

Features of the disclosure are initially described in the context of a memory system and memory die as described with reference to FIGS. 1-2. Features of the disclosure are described in the context of code word formats, rotation index formats, and a process flow as described with reference to FIGS. 3-5. These and other features of the disclosure are further illustrated by and described with reference to an apparatus diagram and flowcharts that relate to intra-code word wear leveling techniques as described with references to FIGS. 6-8.

FIG. 1 illustrates an example of a computing system 100 that supports intra-code word wear leveling techniques in a memory system in accordance with aspects disclosed herein. The computing system 100 may include a host device 105 coupled with a device 140 through a host interface 115 (which may also be referred to as a host link). The host device 105 may be or include a server, a system on a chip (SoC), a central processing unit (CPU), or a graphics processing unit (GPU), among other examples. In some examples, the host device 105 may access (e.g., read from, write to) one or more memory media 130 located in the device 140 through the host interface 115.

The host interface 115 (e.g., a host link) may be compatible with or employ a protocol (e.g., the Gen-Z, the Cache Coherent Interconnect for Accelerators (CCIX) protocol) to facilitate access operations between the host device 105 and the one or more memory media 130. The host interface 115 may be configured to transfer data at a first data transfer rate (e.g., 25 gigabytes per second (GBps)) in at least one direction (e.g., sending or receiving). In some examples, a 25 GBps data transfer rate may support approximately 586 million transactions per second when a transaction size is 64 bytes. In other examples, a 25 GBps data transfer rate may support approximately 312.5 million transactions per second when a transaction size is 128 bytes.

The device 140 may, in some cases, be referred to as a memory system or subsystem, or a memory device. In some cases, the device 140 may include a power management component. The power management component may monitor a power level that may indicate a power change or loss related to the device 140 or the computing system 100. In some cases, the power level may fluctuate beyond a normal range to indicate such a power change or loss incident. The device 140 may include a controller 120 that may be coupled with one or more memory media 130 through channels 125. In some cases, the channels 125 may be referred to as aggregated channels 125 including a plurality of other channels (e.g., channels having a smaller bandwidth than the aggregated channel 125) as described with reference to FIG. 2. The device 140 may include a non-volatile memory 131 that is coupled with the controller 120 through a channel 126. In some examples, the controller 120, the one or more memory media 130, or the non-volatile memory 131, or any combination thereof, may be integrated with, in contact with, or placed on a board (e.g., a peripheral component interconnect express (PCIe) board). In some cases, the non-volatile memory 131 may be integrated as part of the controller 120.

The controller 120 may include various functional blocks that facilitate operations of the device 140 in conjunction with the one or more memory media 130. In some case, the power management component may be integrated as part of the controller 120. In some cases, the controller 120 may include aspects of an interface controller to accommodate different specifications, constraints, or characteristics associated with the host interface 115, the channels 125, the channel 126, or any combination thereof. In some examples, the controller 120 may be an ASIC, a general-purpose processor, other programmable logic device, discrete hardware components (e.g., a chiplet), or it may be a combination of components.

In some cases, the controller 120 may read data from or write data at a memory medium 130 (e.g., a memory medium 130-a) in conjunction with a local controller (e.g., local to the memory medium 130-a) that may perform various operations (e.g., writing data to memory cells, reading data from memory cells, arranging a code word in accordance with a code word format described with reference to FIG. 3). In some examples, the local controller may send requested data to the controller 120 through one of the channels 125, which may be an example of an aggregated channel.

Each memory medium (e.g., a memory medium 130-a) may include multiple memory dice (e.g., forty-four (44) memory dice) to obtain a specified or desired memory capacity of the memory medium. In some examples, the memory dice may include a three-dimensional cross-point array of memory cells including chalcogenide (e.g., 3DXP memory dice including 3D XPoint™ memory cells). In other examples, the memory dice may include other kinds of memory devices (e.g., FeRAM dice, MRAM dice, PCM dice). In some examples, a code word (e.g., a code word including 128 bytes of user data) may be divided across the multiple memory dice within a memory medium (e.g., a memory medium 130-a).

In some cases, each memory die (e.g., each 3DXP memory die) of the multiple memory dice may produce a quantity of data (e.g., 128 bits of data) as a unit from the memory die in association with an access operation (e.g., a read operation). The amount of data (e.g., 128 bits of data)

may include a sequence of bursts (e.g., sixteen (16) bursts), each burst including an amount of data (e.g., eight (8) bits of data) transmitted over a bus (e.g., 8-bits wide bus) from the memory die. As an example, when a memory medium includes eleven (11) memory dice operating in parallel, and when each memory die of the eleven (11) memory dice produces eight (8) bits of data at a given burst, the memory medium may produce 88 bits of data for the given burst. As eleven (11) memory dice may produce data over a total of sixteen (16) bursts, each burst including 88 bits of data from eleven (11) memory dice, a unit of data associated with the memory medium during an access operation—e.g., the unit of data transmitted over the channel (e.g., an aggregated channel)—may include 1,408 bits.

As such, a code word (e.g., a unit of data during a transaction of an access operation) associated with a memory medium may include 1,408 bits, in this example. In some cases, a burst may be referred to as a channel burst or a data burst. In some cases, a channel between the controller 120 and a memory medium (e.g., a memory medium 130-a) may include a plurality of channels, in which each channel may be associated with one or more memory dice of the memory medium (e.g., a memory medium 130-a).

The channels 125 may be configured to transport data (e.g., a code word) between the controller 120 and the one or more memory media 130. Each of the channels 125 (e.g., the channel 125-a that may be an example of an aggregated channel) may include a plurality of other channels (e.g., channels having a smaller bandwidth than the channel 125-a) for transporting data (e.g., a code word) in parallel. In some cases, a code word may include user data (e.g., 128 bytes of user data in a code word) and other sets of data (e.g., remaining data in the code word to produce reliable data with a low latency). Each of the channels 125 (e.g., the channel 125-a that may be an example of an aggregated channel) may include additional channels to carry information related to various auxiliary functions such as metadata. In some cases, a code word format (which may also be referred to as a code word layout) or a forwarded code word format (e.g., a forwarded code word layout) may define how each of the channels 125 (e.g., the channel 125-a) may transport data (e.g., a code word) between the controller 120 and the one or more memory media 130.

The non-volatile memory 131 may include an array of non-volatile memory cells that may maintain their logic states for an extended period of time even in the absence of an external power source. For example, the non-volatile memory cells may be or include 3D XPoint™ memory cells, PCM cells, FeRAM cells, or NAND memory cells, among other examples. Further, the non-volatile memory 131 may be configured to communicate information with the controller 120 through the channel 126. For example, the non-volatile memory 131 may receive information from the controller 120 through the channel 126 and save the information when a power change or loss related to the computing system 100 is detected.

In some cases, the memory subsystem or system, which may include device 140, may include a power management component to manage a power change or loss incident. The power management component may be operable to detect a sign of power change or loss (e.g., a power level indicating a power change or loss that may occur) and transmit an indication of the sign of power change or loss to the controller 120. The controller 120 may, upon receiving the indication, transfer information (e.g., an indication of error status associated with a code word, one or more indications of spare bit assignments to erroneous bits) saved in a memory array (e.g., SRAM memory array) in the controller 120 to the non-volatile memory 131. The non-volatile memory 131 may save the information such that the information may be preserved in the absence of a power supply to the memory subsystem or system, which may include device 140. When the power to the computing system 100 is restored or otherwise adjusted, the controller 120 may retrieve the information from the non-volatile memory 131 to resume an operation that has been interrupted by the power change or loss incident based on the information preserved in the non-volatile memory 131.

The controller 120 may, as part of one or more background operations in some cases, read a code word from a memory medium (e.g., a memory medium 130) that includes a set of minimum substitutable regions (MSRs). The code word may include a plurality of bits that may each correspond to a respective MSR of the set. The controller 120 may identify a quantity of erroneous bits in the code word using an error control operation and set (e.g., initially set, update) a value of a counter associated with an MSR of the set (e.g., an MSR of the set corresponding to an erroneous bit of the quantity) based on identifying the quantity of erroneous bits in the code word. Further, the controller 120 may determine the value of the counter relative to a threshold and assign a spare bit of the code word to the erroneous bit of the quantity based on the value of the counter relative to the threshold. In some cases, the threshold may be referred to as a bit-level replacement threshold.

In some cases, the controller 120 may write an indication of the spare bit assignment with respect to the erroneous bit of the quantity to a memory array of the controller 120 based on assigning the spare bit of the code word. The memory array may be configured to save a plurality of such indications associated with spare bits and may include SRAM cells. In some cases, the controller 120 may configure (e.g., program, adjust) the threshold with respect to an error rate, such as a raw bit error rate (RBER), associated with the memory medium based on identifying the quantity of erroneous bits in the code word. In other cases, the controller 120 may configure the threshold with respect to a size of an MSR of the set based on identifying the quantity of erroneous bits in the code word.

Figure 2:
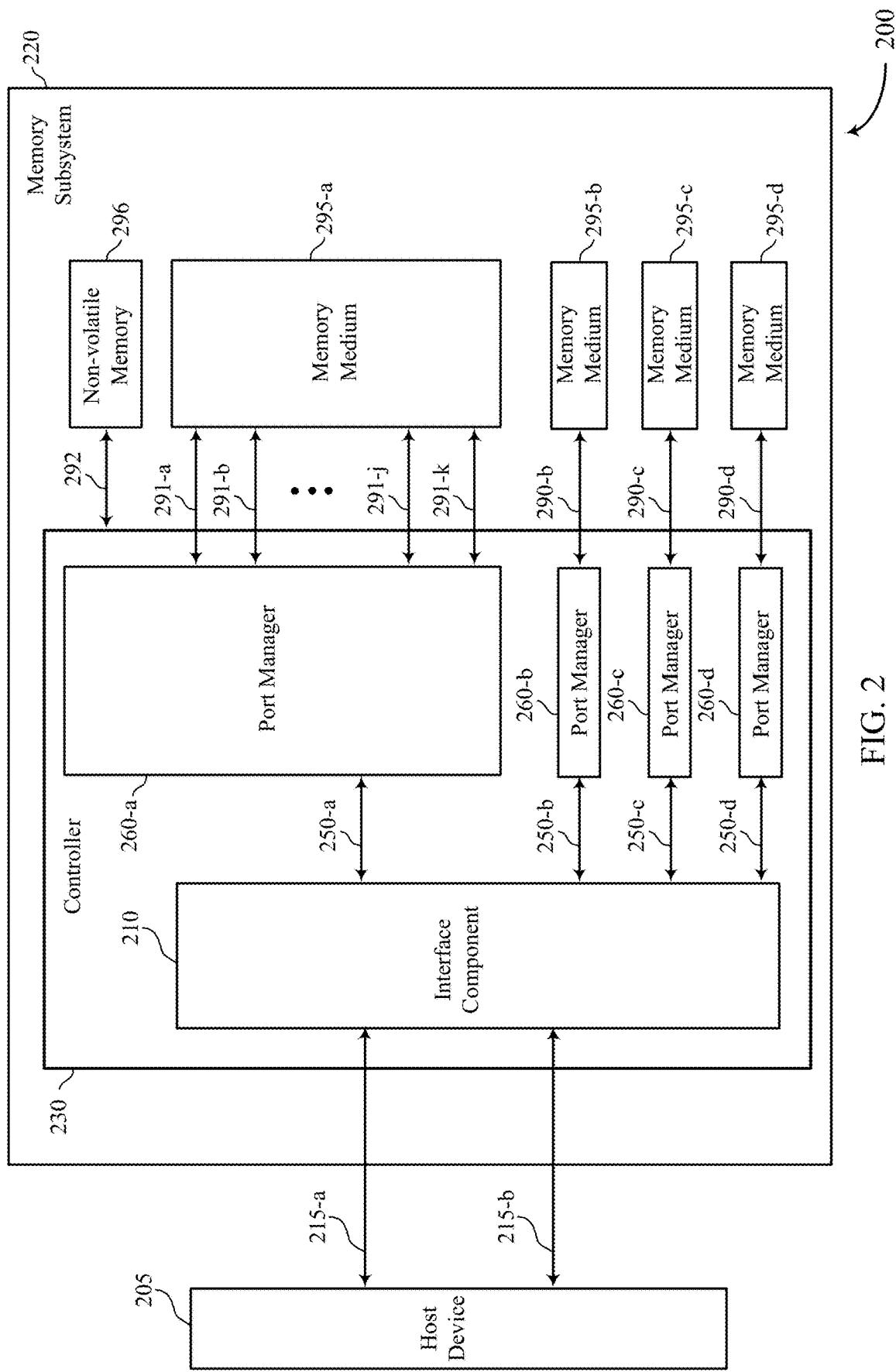
FIG. 2 illustrates an example of a computing system that supports intra-code word wear leveling techniques in accordance with aspects disclosed herein.

FIG. 2 illustrates an example of a computing system 200 that supports intra-code word wear leveling techniques in a memory system in accordance with aspects disclosed herein. The computing system 200 may be an example of the computing system 100 described with reference to FIG. 1. The computing system 200 may include a host device 205 coupled with a memory subsystem or system 220 using at least one host interface (e.g., a host interface 215-a). In some cases, the host interfaces 215 may be referred to as a host link or host links. The host device 205 may be an example of the host device 105 described with reference to FIG. 1. The host interfaces 215 may be examples of the host interface 115 described with reference to FIG. 1. In some examples, the host interfaces 215 may be configured to transfer data at a first data transfer rate (e.g., 50 GBps with 25 GBps in each direction).

The computing system 200 may include the memory subsystem or system 220. The memory subsystem or system 220 may be an example of the device 140 described with reference to FIG. 1. The memory subsystem or system 220 may be referred to as a memory device or memory devices. The memory subsystem or system 220 may include a controller 230. In some cases, the memory subsystem or system 220 may include a power management component. The power management component may monitor a power level that may indicate a power change or loss related to the memory subsystem or system 220 or the computing system 200. In some cases, the power level may fluctuate beyond a normal range to indicate such a power change or loss incident. The controller 230 may be an example of the controller 120 described with reference to FIG. 1. The controller 230 may include an interface component 210 and a plurality of port managers 260. In some cases, the power management component may be integrated as part of the controller 230.

The interface component 210 may be configured to facilitate data exchange between the host device 205 and the memory subsystem or system 220 through the host interfaces 215. The interface component 210 may be configured to exchange data with the plurality of port managers 260 (e.g., using signal paths 250). Each signal path of the signal paths 250 may be configured to exchange data at a rate (e.g., 12.8 GBps) different than the first data transfer rate of the host interfaces 215. In some cases, the interface component 210 may be configured to provide a routing network function to allow more than one host interface (e.g., host interface 215-a and host interface 215-b) to be associated with the plurality of port managers 260.

The memory subsystem or system 220 may include a non-volatile memory 296. The non-volatile memory 296 may be configured to communicate information with the controller 230 through a channel 292. The non-volatile memory 296 may be an example of the non-volatile memory 131 described with reference to FIG. 1. Also, the channel 292 may be an example or include aspects of the channel 126 described with reference to FIG. 1. Further, the non-volatile memory 296 may be configured to communicate information with port managers 260 in the controller 230. For example, the port managers 260 may transfer various information (e.g., one or more indications of spare bit assignments to erroneous bits) to the non-volatile memory 296 through the channel 292 and save the information in the non-volatile memory 296 when the port managers 260 receive an indication of a power change or loss related to the computing system 200 or the memory subsystem or system 220. In some cases, the non-volatile memory 296 may be integrated as part of the controller 230.

Each port manager (e.g., the port manager 260-b) of the plurality of the port managers 260 may be coupled with a memory medium (e.g., the memory medium 295-b) through an aggregated channel (e.g., the aggregated channel 290-b). In some cases, each port manager of the plurality may be coupled with different one or more memory media 295. In some examples, an individual port manager (e.g., the port manager 260-a) of the plurality of port managers 260 may operate independent of each other (e.g., the port managers 260-b, 260-c, and 260-c) and may support access operations or background operations associated with one or more memory media 295. The one or more memory media 295 may be examples of the one or more memory media 130 described with reference to FIG. 1. In some cases, each of the one or more memory media 295 may be referred to as a media port.

Each aggregated channel of the aggregated channels 290 may include one or more channels 291. In some cases, the channels 291 may be referred to as logic channels 291. In some examples, each channel 291 may be associated with one or more memory dice in a memory medium (e.g., the memory medium 295-a) and may have a smaller bandwidth than the bandwidth of the aggregated channel (e.g., the aggregated channel 290-b). In some examples, an aggregated channel (e.g., an aggregated channel 290-a) may include eleven (11) channels 291 (e.g., channels 291-a through 291-k). As a person of ordinary skill in the art would appreciate, the plurality of channels 291 (e.g., the channels 291-a through the channel 291-k) are depicted for the port manager 260-a representing one of the aggregated channels 290 (e.g., the aggregated channel 290-a) while the other aggregated channels 290 (e.g., the aggregated channels 290-b, 290-c, and 290-d) are depicted for port managers 260-b, 260-c, and 260-d without showing the plurality of channels 291 associated with each aggregated channel, which is so depicted in order to increase visibility and clarity of the illustrated features.

An individual memory medium (e.g., the memory medium 295-a) of the one or more memory media 295 may include one or more memory devices (e.g., 3DXP memory dice). In some cases, the memory devices in the individual memory medium may be configured to operate in parallel to obtain a desired (or a specified) aggregated bandwidth through one of the aggregated channels 290. A 3DXP memory die, as one example, may be configured to have a 8-bits wide data bus and may be associated with each of channels 291 (e.g., the channel 291-a) rendering each channel 291 being 8-bits wide. In addition, a 3DXP memory die may be configured to produce 128-bits of data during a sequence of sixteen (16) bursts, in which each burst may produce 8-bits wide data over the channel 291. As such, 128-bits of data may be considered as a single unit of data that each 3DXP memory die generates based on an access command (or during a background operation) reading memory cells within the 3DXP memory die.

In some cases, a code word (or a forwarded code word) may be configured to include a set of bit fields indicative of a plurality of data bursts (e.g., a sequence of sixteen (16) bursts) across a plurality of channels (e.g., eleven (11) channels 291-a through 291-k generating 88 bits of data per data burst). As such, the code word may in some cases include 1,408 bits of information. The description herein may be understood from a logical view of the memory medium. A larger quantity of physical 3DXP memory dice than a quantity of logical 3DXP memory dice may be present in a memory medium accounting for an overhead related to various access operations (e.g., read operation, write operation) or background operations associated with the memory medium. Within a memory medium, a code word may be divided into parts and written to or read from more than one die (e.g., 128 byte user data retained across ten (10) 3DXP memory dice) as described with reference to FIG. 3.

Various examples described herein use 3DXP memory dice (e.g., including 3D) XPoint™ memory cells) to illustrate how the memory media 295 may be configured and operate in conjunction with the port managers 260 in accordance with the methods, devices, and systems supporting spare substitution in a memory system disclosed herein. In some cases, the memory media 295 may include other types of memory devices employing different memory technologies than 3DXP memory technology, such as FeRAM technology, PCM technology, MRAM technology, among others. As such, the concepts disclosed herein are not limited to a particular memory technology (e.g., 3D XPoint™ memory technology).

In some cases, a port manager (e.g., a port manager 260-a) may, as part of a read operation, receive a first portion of a code word from a memory medium (e.g., the memory medium 295-a). The code word may include a set of bit fields indicative of a plurality of data bursts across a plurality of channels (e.g., channels 291-a through 291-k). The port manager may identify a spare bit in the first portion of the code word to replace a bit field of the set. The port manager may determine, based on identifying the spare bit, the bit field of the set to be replaced by the spare bit. The port manager may also receive a second portion of the code word (e.g., one or more other data bursts) including the bit field of the set to be replaced by the spare bit. In some cases, the port manager may replace the bit field of the set in the second portion of the code word with the spare bit concurrently with receiving the second portion of the code word. As such, the spare bit may be multiplexed with a series of data bursts into a bit stream of the code word adding minimal or essentially no additional latency (other than the latency of the multiplexing component).

In some cases, the port manager may access a memory array of the port manager to determine the bit field of the set in the second portion of the code word to be replaced by the spare bit. The memory array may be configured to retain an indication of a spare bit assignment to a bit field of the set of the code word and may include SRAM cells. In some cases, the port manager may perform an error control operation for the code word based on replacing the bit field of the set in the second portion with the spare bit. In some cases, a size of the memory array (e.g., SRAM cells) for retaining the indication of the spare bit assignment may be based on an identification of a channel of the plurality, a quantity of spare bits in the code word, an identification of one or more MSRs of a quantity of MSRs associated with the code word, a quantity of bits associated with forwarded code words in the memory medium, an error correction capability for an indication of a spare bit assignment, a quantity of memory dice corresponding to a channel of the plurality, a quantity of MSRs in a memory die of the quantity, or a bit indicating a change in a spare bit assignment, or any combination thereof, among other examples.

Figure 3:
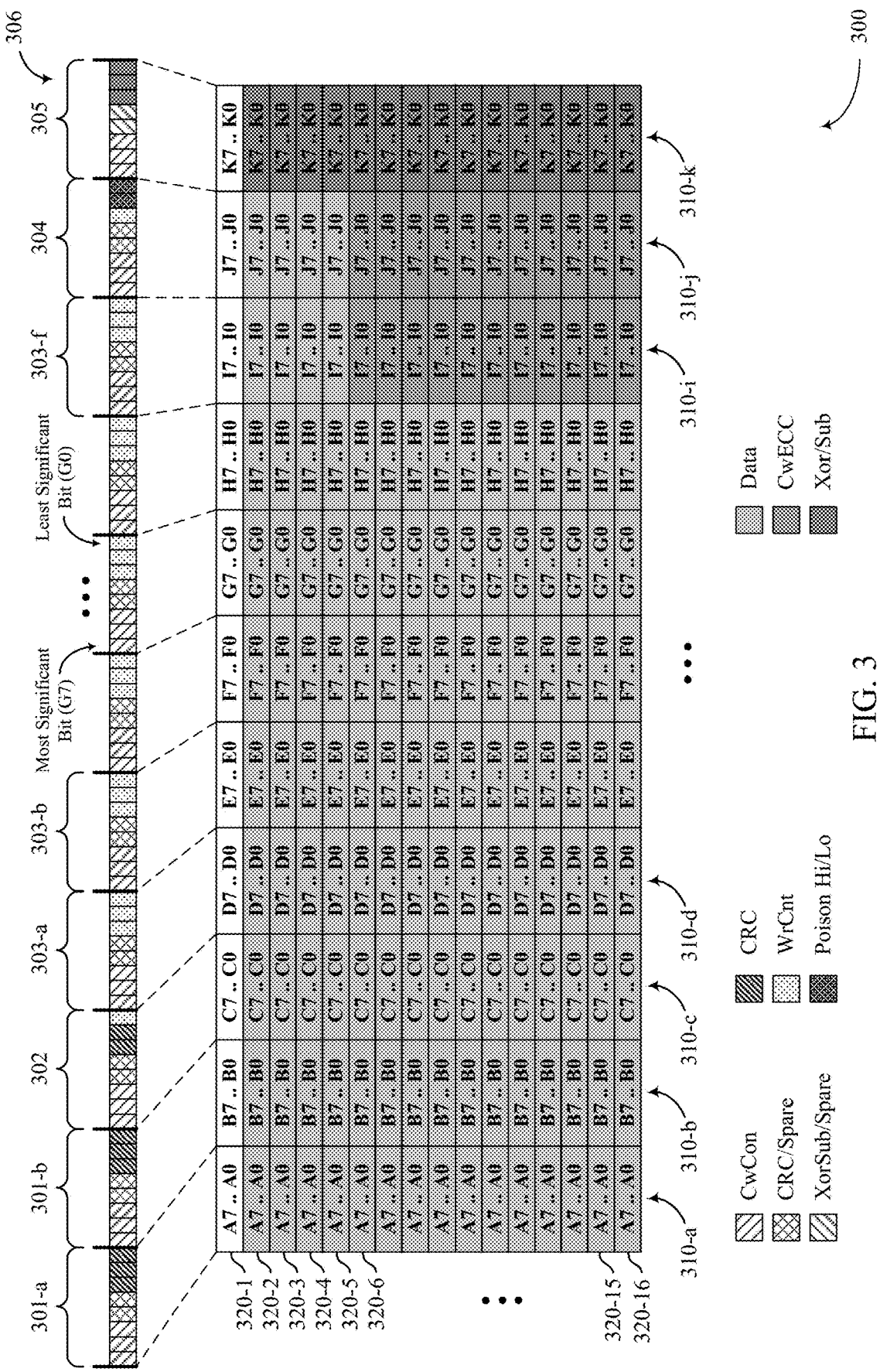
FIG. 3 illustrates an example of a code word format that supports intra-code word wear leveling techniques in accordance with examples as disclosed herein.

FIG. 3 illustrates an example of a code word format 300 (which may also be referred to as a code word layout 300) that supports intra-code word wear leveling techniques in a memory system in accordance with aspects disclosed herein. The code word format 300 may be an example of a code word format for an entire code word. A code word may include a set of bit fields indicative of a plurality of data bursts across a plurality of channels (e.g., channels 291-a through 291-k described with reference to FIG. 2). FIG. 3 also includes formats 301 through 305 (also referred to as layouts) illustrating various configurations for an individual channel (e.g., the channel 291-a described with reference to FIG. 2). FIG. 3 also illustrates a format 306, which may correspond to a portion of a code word (e.g., a subset of bit fields during one or more first data bursts across the plurality of channels).

As an example of a code word format and structure, the code word format 300 may include a quantity of fields (e.g., bit fields) of data (e.g., 1,408 bits of data) that may be produced by a memory medium (e.g., the memory medium 130-a or the memory medium 295-a described with reference to FIGS. 1 and 2) in response to an access command, or during a background operation, or both. The code word may include 128 bytes (e.g., 1,024 bits) of user data. Remaining bit fields within the code word (e.g., 384 bits of data) may carry various information that may facilitate transferring of accurate user data during an access operation, or during a background operation, or both. Further, the remaining bits carrying the various information may be configured to facilitate low latency operations (e.g., spare substitution) associated with the code word during an access operation.

The code word format 300 may span a plurality of channels (e.g., channels 310-a through 310-k). One of these channels (e.g., channels 310-a through 310-k) may be an example of or include aspects of a channel 291 (e.g., a channel 291-a) described with reference to FIG. 2. In some cases, each channel (e.g., the channel 310-a) of the plurality of channels 310 may be associated with one or more 3DXP dice, which may include an 8-bit wide data bus. For example, each channel may produce a total of 128 bits of data as a single object of a transaction (e.g., communication, operation) associated with an access command (e.g., a read command), or a background operation, or both. Further, the 128 bits of data may be produced as a sequence of sixteen (16) data bursts, each data burst configured to produce eight (8) bits of data over the 8-bit wide data bus. Hence, each channel (e.g., each of the channels 310-a through 310-k) within a code word format may correspond to 128 bits of data including sixteen (16) groups of 8-bit of data—e.g., G7 . . . G0 for channel 310-g, where G7 . . . G0 may represent a series of eight (8) 0s and is in which G7 may be the most significant bit (e.g., the eighth bit of the series of eight (8) 0s and 1s) and G0 may be the least significant bit (e.g., the first bit of the series of eight (8) 0s and 1s)), in which each group of sixteen (16) groups of 8-bits of data may be associated with one of sixteen (16) data bursts.

In one example, the code word format 300 may span across eleven (11) channels and each channel of the eleven (11) channels may produce 8-bits of data at each data burst, and a total of 88 bits of data may be produced at each data burst across the eleven (11) channels (e.g., the first data burst 320-1 of 88 bits of data). Thus, the code word format 300 may include 1,408 bits of data (e.g., the first data burst 320-1 through the 16th data burst 320-16 with each data burst producing 88 bits of data) as a single object of a transaction for a memory medium (e.g., the memory medium 130-a or the memory medium 295-a). The code word format 300 may support a reliable transaction (e.g., conveying accurate contents of user data) having a low latency (e.g., a low quantity of clock edges to produce the user data).

Each field (e.g., each bit field) or a set of fields (e.g., a set of bit fields) within a code word may include information that facilitates reliable transactions of user data with low latency. In some cases, one or more fields (e.g., bit fields) within a code word format may be configured to indicate a code word condition (e.g., using one or more CwCon bits). A code word may be configured in one of multiple possible states (e.g., four states) indicated using the CwCon bits. In some cases, one or more fields within a code word format may be configured to indicate a quantity of access operations (e.g., read operations, write operations) associated with the code word (e.g., WrCnt bits). In some cases, one or more fields within a code word format may be configured to indicate that a portion of the code word may be invalid (e.g., using poison bits).

In some cases, one or more fields within a code word format may be configured as cyclic redundancy check (CRC) bits that may identify erroneous bits related to an error control operation. In some cases, one or more fields within a code word format may be configured as code word error control code bits (e.g., CwECC bits) that support an error control operation. In some cases, one or more fields within a code word format may be configured as exclusive OR (XOR) bits. Each of the XOR bits may include a digital or Boolean logic XOR product of corresponding bits of other channels of a respective data burst. As such, the XOR bits may support repairing corresponding bits of other channels and may be referred to as repair bits. In some cases, each XOR bit (e.g., XOR/Sub bits or XORSub bits) may substitute a field within a code word instead of repairing the field.

In some cases, one or more fields within a code word format may be configured as spare bits (e.g., CRC/Spare bits, XORSub/Spare bits). The bits configured as spare bits may be configured as CRC bits or XOR bits (or XORSub bits), among other alternatives. As an example, the code word format 300 depicted in FIG. 3 may include up to twenty-two (22) spare bits—e.g., twenty (20) CRC/Spare bits and two (2) XORSub/Spare bits. Namely, some CRC bits may be configured as spare bits. Similarly, some repair bits (e.g., XORSub bits) may be configured as spare bits. As such, a quantity of spare bits within a code word may be configurable because the quantity of spare bits may be exchangeable for a quantity of the CRC bits or the XORSub bits. In some cases, the quantity of spare bits in a code word may be determined based on a maturity of memory technology (e.g., 3D XPoint™, FeRAM, MRAM technologies) used to build memory media (e.g., memory media 130, memory media 295).

In some cases, spare bits may be configured to operate as spares to replace bits of the code word designated to have failed (e.g., erroneous bits). In some cases, the bits designated to have failed may be associated with an MSR (e.g., an MSR including a quantity of memory cells, which may have become faulty or unreliable) of a memory die. The spare bits (e.g., MSRs corresponding to the spare bits) may be routed (e.g., multiplexed using a multiplexing component) to replace (e.g., substitute) the bits designated to have failed (e.g., MSRs corresponding to the erroneous bits) to support a reliable transaction of the user data within the code word.

Still referring to FIG. 3, various fields (e.g., bit fields) within a code word format may be configured (e.g., arranged) to support a low latency operation during an access operation associated with a memory medium. FIG. 3 includes formats 301 through 305 illustrating various configurations of a group of 8-bits for an individual channel (e.g., each of the channels 310-a through 310-k). For example, each format of the formats 301 through 305 includes a group of eight (8) bits that a memory device (e.g., 3DXP die) within a memory medium (e.g., a memory medium 295-a) may produce at a given data burst. The following describes example formats, although the disclosure herein is not limited to these examples.

Format 301 may include one or more (e.g., three) fields of CwCon bits, one or more (e.g., two) fields of CRC/Spare bits (which may be configured as either CRC bits or spare bits), and one or more (e.g., three) fields of CRC bits. Format 302 may include one or more (e.g., three) fields of CwCon bits, one or more (e.g., two) fields of CRC/Spare bits (which may be configured as either CRC bits or spare bits), one or more (e.g., two) fields of CRC bits, and one or more WrCnt bits (e.g., a counter bit).

Format 303 may include one or more (e.g., three) fields of CwCon bits, one or more (e.g., two) fields of CRC/Spare bits (which may be configured as either CRC bits or spare bits), and one or more (e.g., three) fields of WrCnt bits (e.g., a counter bit). Format 304 may include one or more (e.g., three) fields of CwCon bits, one or more (e.g., two) fields of CRC/Spare bits (which may be configured as either CRC bits or spare bits), one or more fields of WrCnt bits (e.g., a counter bit), and one or more (e.g., two) fields of poison bits (e.g., bits indicating invalidity of a portion of the code word). Format 305 may include one or more (e.g., three) fields of CwCon bits, one or more (e.g., two) fields of XORSub/Spare bits (which may be configured as either XORSub bits or spare bits), and one or more (e.g., three) fields of XORSub bits.

The code word format 300 may also illustrate user data field of 1,024 bits (e.g., associated with channels 310-a through 310-h over the second data burst 320-2 through the 16th data burst 320-16, and channels 310-i and 310-j over the second data burst 320-2 through the fifth data burst 320-5), CwECC fields (e.g., associated with channels 310-i and 310-j over the 6th data burst 320-6 through the 16th data burst 320-16), and XOR/Sub fields (e.g., channel 310-k over the second data burst 320-2 through the 16th data burst 320-16).

As an example of a code word format that supports a low-latency operation, a subset of bit fields corresponding to the first data burst (e.g., the data burst 320-1) may be configured as illustrated in the format 306. In the format 306, each group of 8-bits of channel 310-a (e.g., A7 . . . A0) and channel 310-b (e.g., B7 . . . B0) may be configured to have the format 301. Also, a group of 8-bits of channel 310-c (e.g., C7 . . . C0) may be configured to have the format 302. At least some, if not each, group of 8-bits of channel 310-d (e.g., D7 . . . D0) through channel 310-i (e.g., I7 . . . I0) may be configured to have the format 303. A group of 8-bits of channel 310-j (e.g., J7 . . . J0) may be configured to have the format 304. Further, a group of 8-bits of channel 310-k (e.g., K7 . . . K0) may be configured to have the format 305.

As a result of configuring the subset of bit fields (e.g., a total of 88 bits including eight (8) bits from each channel of eleven (11) channels) corresponding to the first data burst (e.g., the first data burst 320-1) of the code word format 300, the first data burst of 88 bits (e.g., the 88 bits of the format 306) may include information to facilitate a low-latency, reliable transaction of an access operation associated with the code word (e.g., reading 1,024 bits of user data). In some cases, a port manager (e.g., a port manager 260-a) may receive a first portion of a code word (e.g., the bits of the format 306 corresponding to the first data burst 320-1) associated with a memory medium. The port manager may parse (e.g., interpret) the first portion of the code word (e.g., identifying spare bits) concurrently with receiving additional portions of the code word (e.g., the bits of the code word format 300 corresponding to a second data burst 320-2, and so on) during subsequent data bursts. As such, the port manager may parallelize various operations associated with the code word to supply reliable, low-latency communication or information exchange with a host.

As an example, within the first data burst (e.g., the first data burst 320-1) as depicted in the format 306, there may be up to twenty-two (22) fields of spare bits, two fields per each channel, across the eleven (11) channels (e.g., channels 310-a through 310-k). In some cases, a controller (e.g., a controller 120 or a port manager 260-a described with reference to FIGS. 1 and 2) may, as part of a read operation, receive a first portion of a code word (e.g., the first data burst 320-1) from a memory medium (e.g., a memory medium 130-a or a memory medium 295-a described with reference to FIGS. 1 and 2). The code word may include a set of bit fields indicative of a plurality of data bursts across a plurality of channels (e.g., channels 310-a through 310-k).

Specific fields (e.g., each bit field) or a set of fields (e.g., a set of bit fields) within a code word may experience increased access operations (e.g., writes) as compared to other fields or sets of fields within the code word. For example, certain bits within a field or a set of fields may have different likelihoods of having an access operation change their memory state (e.g., the logical bit value is toggled). A first set of bits may be unlikely to toggle. As one example, unlikely to toggle bits may include CwCon bits (e.g., bits 0-2 in formats 301-305), some WrCnt bits (bits 5-7 in formats 303-304), Poison Hi/Lo bits (bits 6 and 7 in format 304, or combinations thereof associated with bits in the first data burst 320-1. A next set of bits may be associated with a toggle likelihood that is above the unlikely to toggle bits and may be referred to as less likely to toggle bits. The less likely to toggle bits may include data bits, for example, data bits in data bursts 320-2-320-16. A next set of bits may be associated with a toggle likelihood that is above the less likely to toggle bits and may be referred to as more likely to toggle. The more likely to toggle bits may include CRC bits, CwEcc bits, Xor/Sub bits or bit fields. A next set of bits may be associated with a toggle likelihood that is above the more likely to toggle bit and may be referred to as high likelihood to toggle. The high likelihood to toggle bits may include WrCnt bits associated with format 302 bit 7 in the first data burst 320-1.

According to various aspects, a logical to physical channel mapping or rotation may be applied so that the physical locations that bits, fields or sets of fields are stored at in the memory medium are changed over time. The channel mapping or rotation may be performed on a field-by-field basis and a subset or all logical bit fields may be rotated or moved to an updated physical memory location. Accordingly, each bit from the channels 310-a-310-k may reside in each physical channel/location, and over time, the physical bit locations may experience a leveled or mean toggle rate of the burst group.

Figure 4:
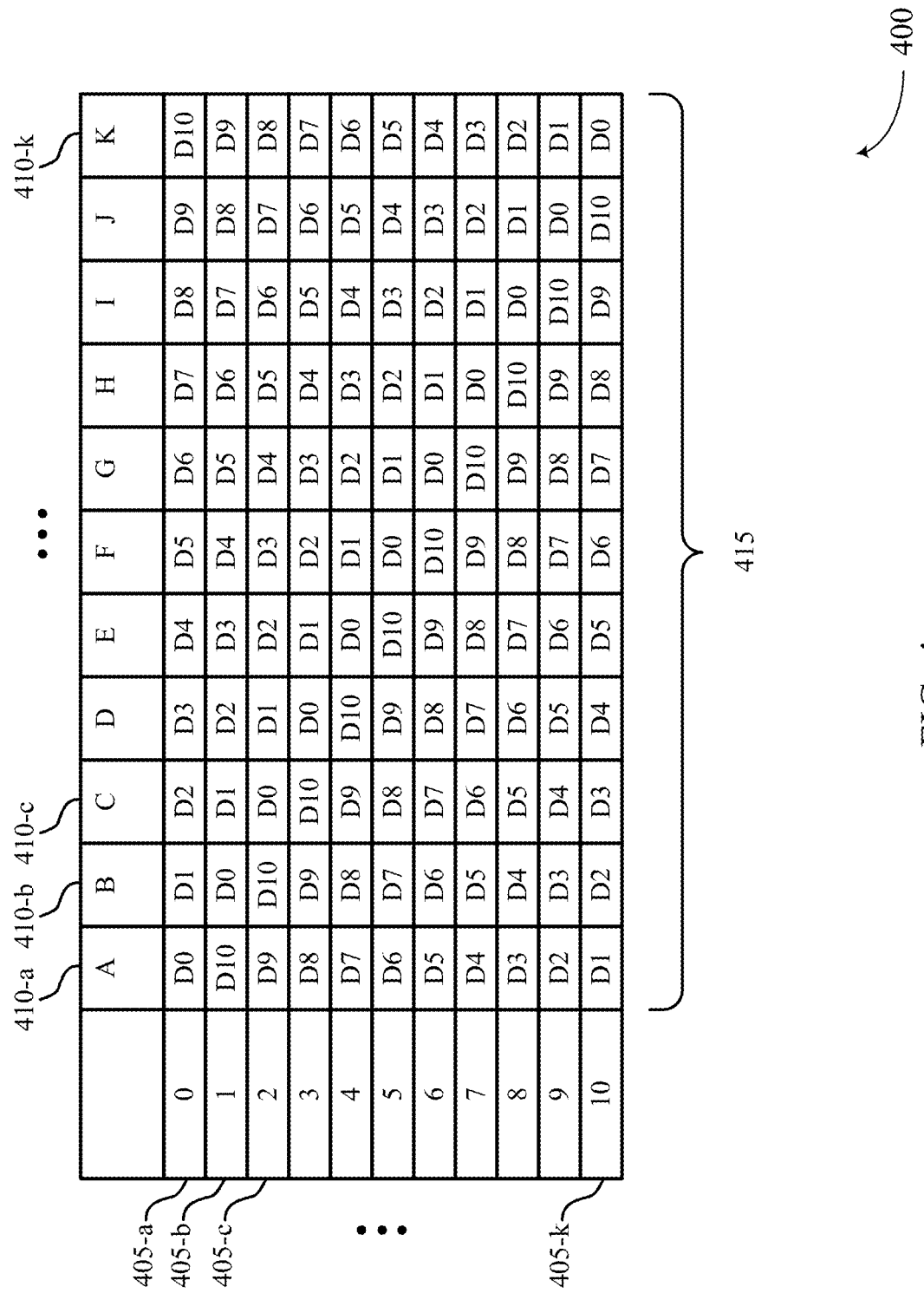
FIG. 4 illustrates an example of a rotation index format that supports intra-code word wear leveling techniques in accordance with examples as disclosed herein.

FIG. 4 illustrates an example of a rotation index format 400 that supports intra-code word wear leveling techniques in accordance with examples as disclosed herein. The rotation index format 400 may include a set of fields indicative of a mapping of logical channels to physical channels for a code word as described herein. The rotation index may include rotation indices 405, a set of logical channel identifiers 410 and a set of physical channel locations 415. The rotation index format 400 may provide a mapping of logical channel identifiers 410 to physical channel identifiers 415 for each rotation indices 405. The logical channel identifiers 410 and physical channel identifiers 415 may be used to identify the logical to physical channel mapping. FIG. 4 illustrates an example where the quantity of physical channels equals the quantity of logical channels. In other cases, the procedures discussed herein may be carried out using different ratios of logical to physical channels. For example, some memory systems may have a greater quantity of physical channels than logical channels. In these examples, additional indices may be used to indicate additional mappings of logical to physical channels according to the techniques described herein.

The rotation indices 405 may designate a logical to physical channel mapping for code words associated with a memory medium and be used to rotate or shift the logical to physical mapping over time. The multiple rotation indices 405 may be associated with different logical channel to physical channel assignments for a memory medium. For example, the memory device may be initiated or initially store data according to a first rotation index 405-a that is associated with a first assignment of logical channels to physical channels. The memory device may also include a pointer associated with the rotation index, which indicates a division between code words whose logical channels are rotated according to the first rotation index and code words whose logical channels are rotated according to a second (e.g., next) rotation index. For example, a controller may identify a pointer that specifies a code word that is to be rotated. The controller may also access the rotation index 405 that is used to provide the new or updated logical to physical channel mapping. As an example, code words that have not undergone the rotation procedure may be mapped according to a first rotation index 405-a. The controller may identify a next codeword to be rotated and update the logical to physical channel mapping from the first rotation index 405-a to a second rotation index 405-b. For example, a first logical channel 410-A (Logical Channel A) may initially be mapped to a first physical memory location (e.g., D0). Then, after the rotation procedure, the first logical channel 410-A may be mapped to a second memory location (e.g., D10) according to the second rotation index 405-b. In some cases, memory location D0 may correspond to a first memory die or memory medium, for example, memory medium 130 discussed with reference to FIG. 1 or memory medium 295 discussed with reference to FIG. 2.

The controller may rotate each set of bits, bit field, set of bit fields or combination thereof for a given code word. For example, the pointer may specify a code word to be rotated and the controller may rotate or move bits associated with each logical channel to a new physical location. In some cases, the controller may perform the rotation on a burst-by-burst basis. For example, the controller may rotate fields in each data burst (e.g., data bursts 320) according to the rotation index.

Each code word stored in one or more regions of memory may be rotated according to the next rotation index 405. For example, a controller may rotate each code word from a first logical to physical channel mapping (e.g., the first rotation index 405-a) to a second logical to physical channel mapping (e.g., the second rotation index 405-b). The controller may use a channel rotation index to track the next code word to be rotated. In some cases, after the controller has rotated each code word in the region of memory the controller may increment or change the rotation index to, another, different rotation index. For example, after rotating each code word from the first rotation index 405-a to the second rotation index 405-b, the controller may rotate each code word from the second rotation index 405-b to a third rotation index 405-c. The controller may continue to rotate the code words according to each rotation indices 405. In some cases, after the code words have been rotated according to the last rotation index, for example, the eleventh rotation index 405-k, the controller may begin again, by rotating the code words from the eleventh rotation index 405-k to the first rotation index 405-a.

In some cases, the pointer may be used to track which code words have been rotated and a current or next code word to be rotated. The pointer may be incremented in a variety of ways. In some examples, the pointer may be increment from a current code word to a next code word. In some examples, the pointer may be incremented based on a timer. In some cases, incrementing the pointer may take into account a quantity of bit flips, access operations (e.g., read, write, etc.), or the like. For example, the pointer will increment after a timer value has satisfied a threshold (e.g., timer reaches a defined value). In some examples, a threshold for the timer or a quantity of access operations may be selected or determined based on an amount of time desired for a full rotation, an overhead tolerance of the memory device, a quantity of bit flips for one or more fields on a code word, or the like. In additional examples, the pointer may be incremented based on access operations occurring at the memory medium. For example, the controller may wait to increment a pointer until after one or more access operations involving a code word have finished. Although described in the context of rotation, other types of rearranging of the channels may be performed. That is, the rotation index may be a mapping index, and different mapping indices may correspond to different mappings of logical channels to physical channels, where consecutive mapping indices may not be associated with rotated mappings.

Figure 5:
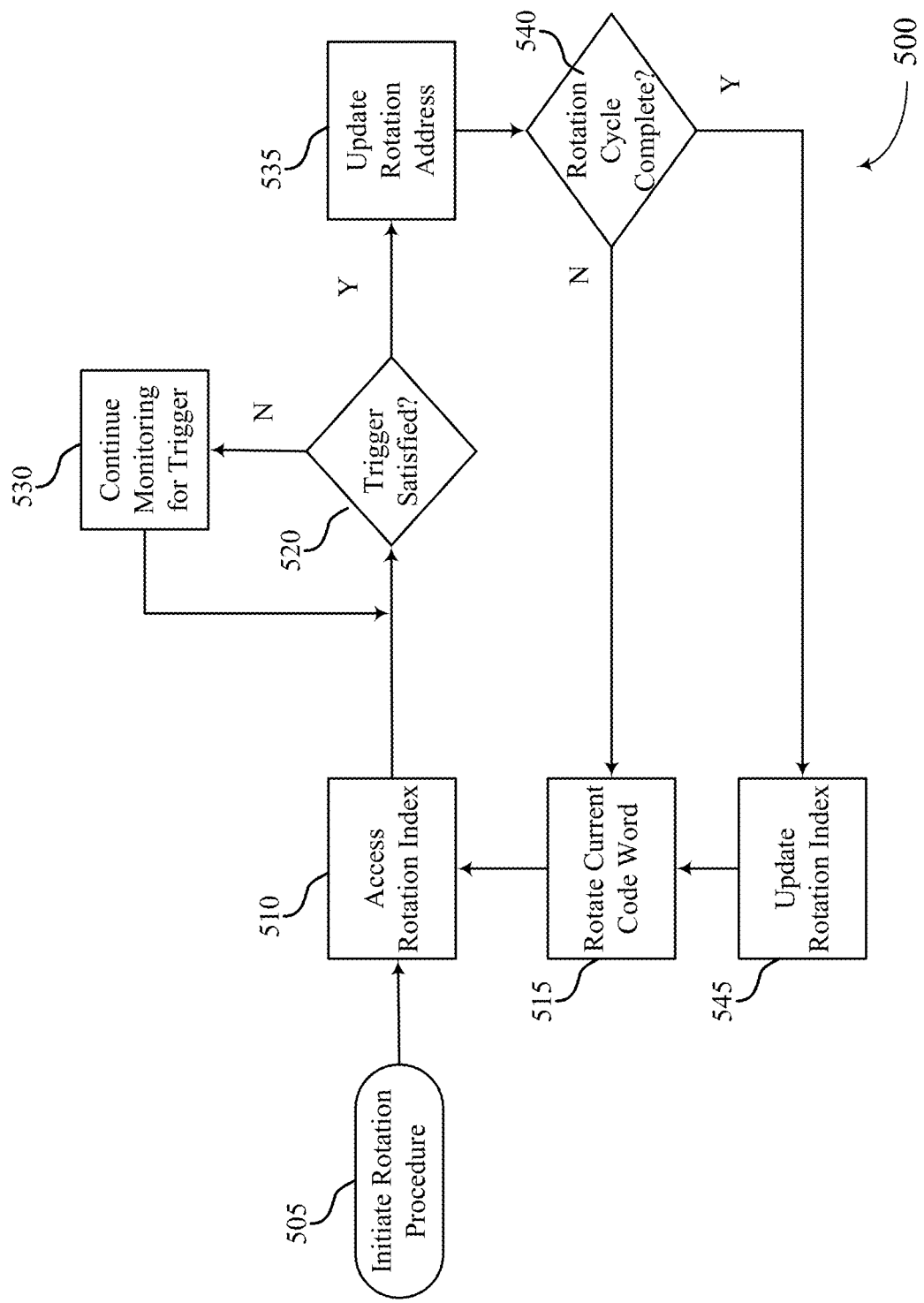
FIG. 5. illustrates an example of a process flow that supports intra-code word wear leveling techniques in accordance with examples as disclosed herein.

FIG. 5 illustrates an example of a process flow 500 that supports intra-code word wear leveling techniques in accordance with examples as disclosed herein. The process flow 500 may be performed by the computing system 100 and 200 as described with reference to FIGS. 1-2 and include aspects of the code word format 300 discussed in relation to FIG. 3 and the rotation index formation 400 discussed in relation to FIG. 4. The process flow 500 includes steps or operations for performing logical to physical channel rotations for one or more code words in a memory region.

At 505, a memory device or controller may initiate a channel rearrangement (e.g., rotation) procedure at one or more memory regions of the memory device. The channel rotation procedure may include identifying a channel rotation address, which may be used to identify the code word that has most recently been rotated in the current cycle. In some cases, the channel rotation address may also be used to indicate which code words have been updated with the current rotation index and which code words have not been updated yet. For example, if code words are being updated from a first logical to physical channel mapping (e.g., first rotation index 405-a) to a second logical to physical channel mapping (e.g., second rotation index 405-b), the rotation index may be identified for any code word whose address is greater than the channel rotation address as the current/not updated rotation index (e.g., first rotation index 405-a). For any code word whose address is less than or equal to the channel rotation address, the rotation index may be an updated rotation index (e.g., second rotation index 405-b), which may be the previous rotation index value plus one (e.g., if the previous rotation index value was 0 then the current rotation index value may be 1). The rotation index may indicate the logical to physical channel mapping as described herein. It should be understood that the channel rotation address may identify an address of a next code word for rotation, in which case any code word whose address is greater than or equal to the channel rotation address would be associated with the current/not updated rotation index (e.g., first rotation index 405-a) while for any code word whose address is less than the channel rotation address, the rotation index may be an updated rotation index (e.g., second rotation index 405-b). It should also be understood that the channel rotation address may be decremented instead of incremented. In either case, a code word address said to be earlier in an address order than the channel rotation address may be understood as one that is associated with the updated rotation index, while a code word address said to be later in an address order than the channel rotation address may be understood as one that is associated with the current/not updated rotation index.

At 510, the memory device or controller may identify the current rotation index and next rotation index (e.g., rotation index 405). The current rotation index value may identify a logical to physical channel mapping (e.g., as described with reference to FIG. 4) for code words that have not been updated in the current rotation cycle and the next rotation index may identify a logical to physical channel mapping for codewords that have been updated in the current rotation cycle. For example, if the controller identifies the first rotation index value 405-a (value 0) then logical channel A 410-A would be mapped to physical memory location D0, logical channel B 410-B would be mapped to physical memory location D1, and so on according to the rotation index formation 400. The next rotation index (e.g., the second rotation index 405-b) may be used by the controller to rotate one or more code words of the memory region.

At 520, the controller may determine whether a trigger condition has been satisfied. For example, the controller may determine whether a timer has been satisfied, whether a quantity of access operations have been performed, or the like. If the trigger has not been satisfied, the controller may continue to monitor the trigger condition or for other commands relating to the rotation procedure at 530. For example, the controller may receive commands to read or write to the codeword, to initiate the rotation procedure at another code word (e.g., a next code word). If the trigger has been satisfied, the controller may proceed to update the channel rotation address at 535. Updating the channel rotation address may include incrementing the channel rotation address or decrementing the channel rotation address, depending on a direction of a rotation cycle. In some cases, the channel rotation address may not be incremented or decremented for the first time through a cycle.

At 540, the controller may determine whether the code word rotation cycle is complete. In some cases, the rotation cycle will be considered complete if each code word in the region of memory has been rotated according to the next rotation index value. If the rotation cycle has not completed, the controller may proceed to 515 to rotate the next code word specified by the channel rotation address using the current rotation index value. At 515, the controller may rotate the code word identified by the channel rotation address according to the logical channel to physical channel mapping indicated by the rotation index. The controller may perform one or more access operations (e.g., read, write, etc.) to move or copy fields of the code word from a first physical memory location to an updated physical memory location based on the logical to physical channel mapping. For example, the controller may update the fields of a code word on a burst-by-burst basis. This may include reading each channel of a burst (e.g., burst 320) and writing the data from each channel of the burst to the new physical memory location based on the next/updated rotation index. In some cases, each data burst of the code word may be written to the next/updated rotation index to complete a rotation procedure to the code word.

If the rotation cycle has completed (e.g., the updated channel rotation address is outside an address space for the memory), the controller may update the rotation index at 545. For example, if the current rotation index is a first rotation index value 405-a (value 0), the controller may update the current rotation index to a second rotation index value 405-b (value 1). In some cases the controller may also reset the channel rotation address (e.g., to zero or to a highest address of an address space). The controller may continue or restart the rotation procedure using the logical channel to physical channel mapping specified by the second rotation index value 405-b.

Figure 6:
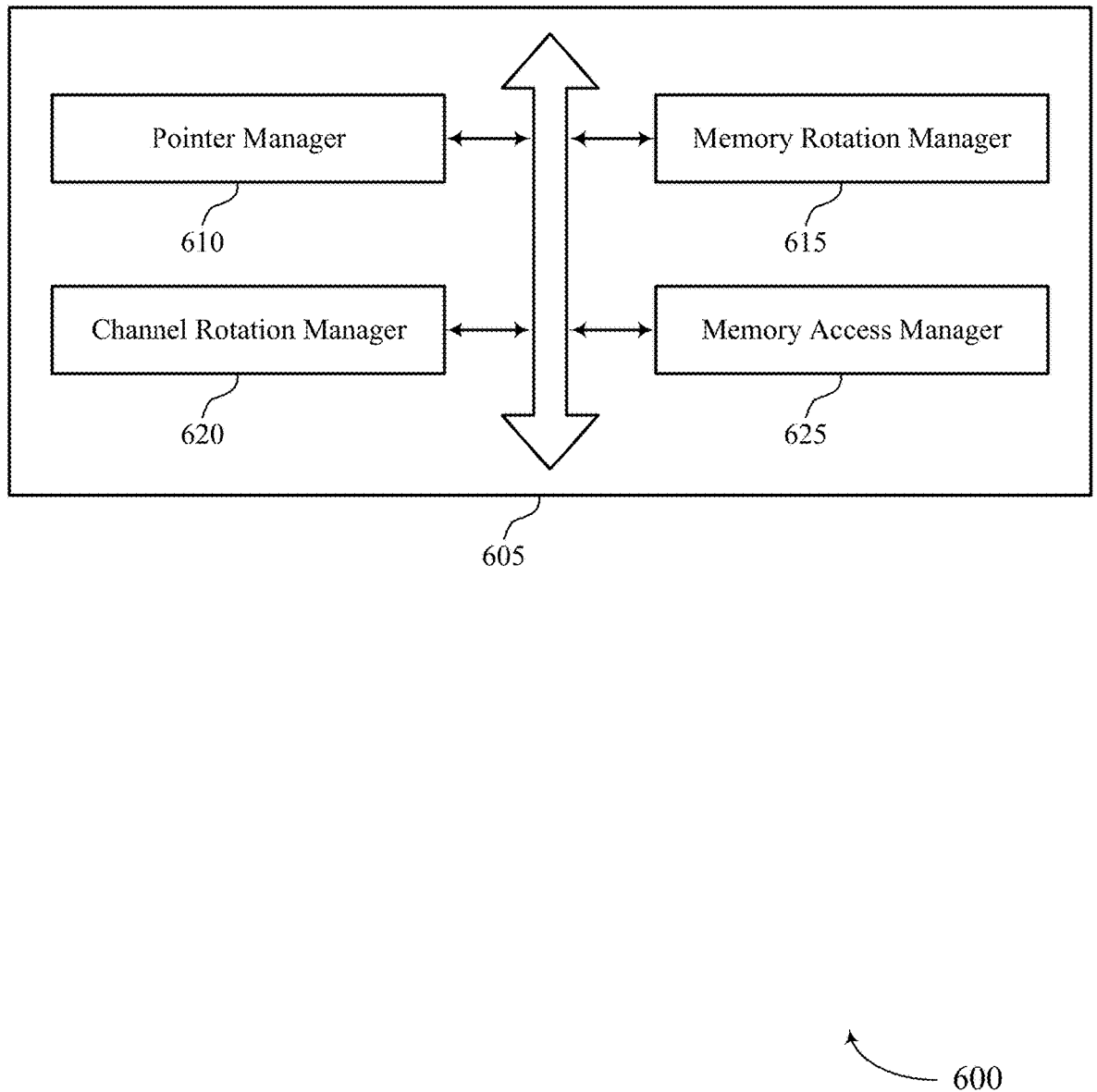
FIG. 6 shows a block diagram of a memory device that supports intra-code word wear leveling techniques in accordance with examples as disclosed herein.

FIG. 6 shows a block diagram 600 of a memory device 605 that supports intra-code word wear leveling techniques in accordance with examples as disclosed herein. The memory device 605 may be an example of aspects of a memory device as described with reference to FIGS. 1 through 5. The memory device 605 may include multiple channels associated with memory medium. The memory device 605 may include a pointer manager 610, a memory rotation manager 615, a channel rotation manager 620, and a memory access manager 625. Each of these modules may communicate, directly or indirectly, with one another (e.g., via one or more buses).

The pointer manager 610 may update a value of a pointer associated with a range for the rotation index based on a condition being satisfied. In some examples, the pointer manager 610 may update a value of the pointer for the updated rotation index based on the condition being satisfied (e.g., a rotation trigger). In some examples, the pointer manager 610 may update a value of a pointer to indicate the first address upon the expiration of the timer. In some cases, the condition is based on a rotation or rearrangement frequency for the memory medium, completing the rotating or rearrangement, or both. In some examples, the memory access manager 625 may read fields of the first code word from the address of the memory medium corresponding to the updated value of the pointer according to an initial assignment of the set of logical channels to the set of physical channels. In some examples, the memory access manager 625 may write the fields of the first code word to the address of the memory medium corresponding to the updated value of the pointer according to the first assignment of the set of logical channels to the set of physical channels.

The memory access manager 625 may execute access operations on the memory medium, where the executing includes multiplexing the set of logical channels to the set of physical channels based on the rotation index and the pointer. In some examples, the memory access manager 625 may multiplex the set of logical channels to the set of physical channels according to an initial assignment of the set of logical channels to the set of physical channels for addresses of the access operations that are subsequent to the updated value of the pointer in an address order. In some examples, the memory access manager 625 may multiplex the set of logical channels to the set of physical channels according to the first assignment of the set of logical channels to the set of physical channels for addresses of the access operations that are equal to or earlier than the updated value of the pointer in an address order.

The memory rotation manager 615 may identify time periods for rearranging (e.g., rotating) the first code word of the memory medium. For example, the rearranging may occur in intervals inserted between access operations, or in idle periods. In some examples, the memory access manager 625 may monitor, based on identifying the trigger, access operations of the memory medium to determine an idle period for the memory medium, the access operations including accessing code words associated with a set of logical channels. If an idle period occurs at the trigger or within a period of time (e.g., predetermined period of time) of the trigger, the idle period may be used to perform the rearranging of the first code word. If no idle period occurs, the memory rotation manager 615 may force a time period (e.g., by delaying or holding an access operation) for the rearranging to occur. In some cases, the memory rotation manager 615 may not force time periods for rearranging unless a backlog of rearranging occurs (e.g., several triggers have occurred without idle periods for performing corresponding rotations), or an average (e.g., running average) between rearranging exceeds a threshold. In other examples, the memory access manager 625 may insert a time period upon the trigger for the rearranging (e.g., by delaying or holding any pending access operations), without first monitoring for an idle period. In some examples, the memory rotation manager 615 may identify, for a memory medium including a set of physical channels, a trigger to perform a rearrangement (e.g., rotation) procedure for a third address of the memory medium. In some examples, the memory rotation manager 615 may rearrange (e.g., rotate), a code word stored at the third address of the memory medium from the first assignment of the set of logical channels to the set of physical channels to the second assignment of the set of logical channels to the set of physical channels. For example, the rearranging may occur in intervals inserted between access operations, or in idle periods.

In some examples, the channel rotation manager 620 may update the rotation index based on performing the rotating for each address of the memory medium, the updated rotation index indicating a second assignment of the set of logical channels to the set of physical channels for the code words stored in the memory medium. In some examples, the channel rotation manager 620 may determine an expiration of a timer associated with the rotating. In some cases, the mapping or rotation index includes one of a set of index identifiers that are each associated with a different (e.g., rotated) assignment of the set of logical channels to the set of physical channels.

In some examples, the memory access manager 625 may receive, after performing the rotating, a first command to perform a first access operation at a fourth address of the memory medium, the fourth address greater than the third address in the address order. In some examples, executing the first access operation at the fourth address of the memory medium includes assigning the set of logical channels to the set of physical channels based on the first assignment. In some examples, the memory access manager 625 may receive, after performing the rotating, a second command to perform a second access operation at a fifth address of the memory medium, the fifth address less than or equal to the third address in the address order. In some examples, executing the second access operation at the fifth address of the memory medium includes assigning the set of logical channels to the set of physical channels based on the second assignment. Although described in the context of rotation, other types of rearranging of the channels may be performed. That is, the rotation index may be a mapping index, and different mapping indices may correspond to different mappings of logical channels to physical channels, where consecutive mapping indices may not be associated with rotated mappings.

In some examples, rotating or rearranging the first code word of the memory medium includes maintaining an association of the set of physical channels to the set of logical channels for a field of the first code word. In some cases, the field of the first code word includes a same quantity of bits for each of the set of logical channels.

Figure 7:
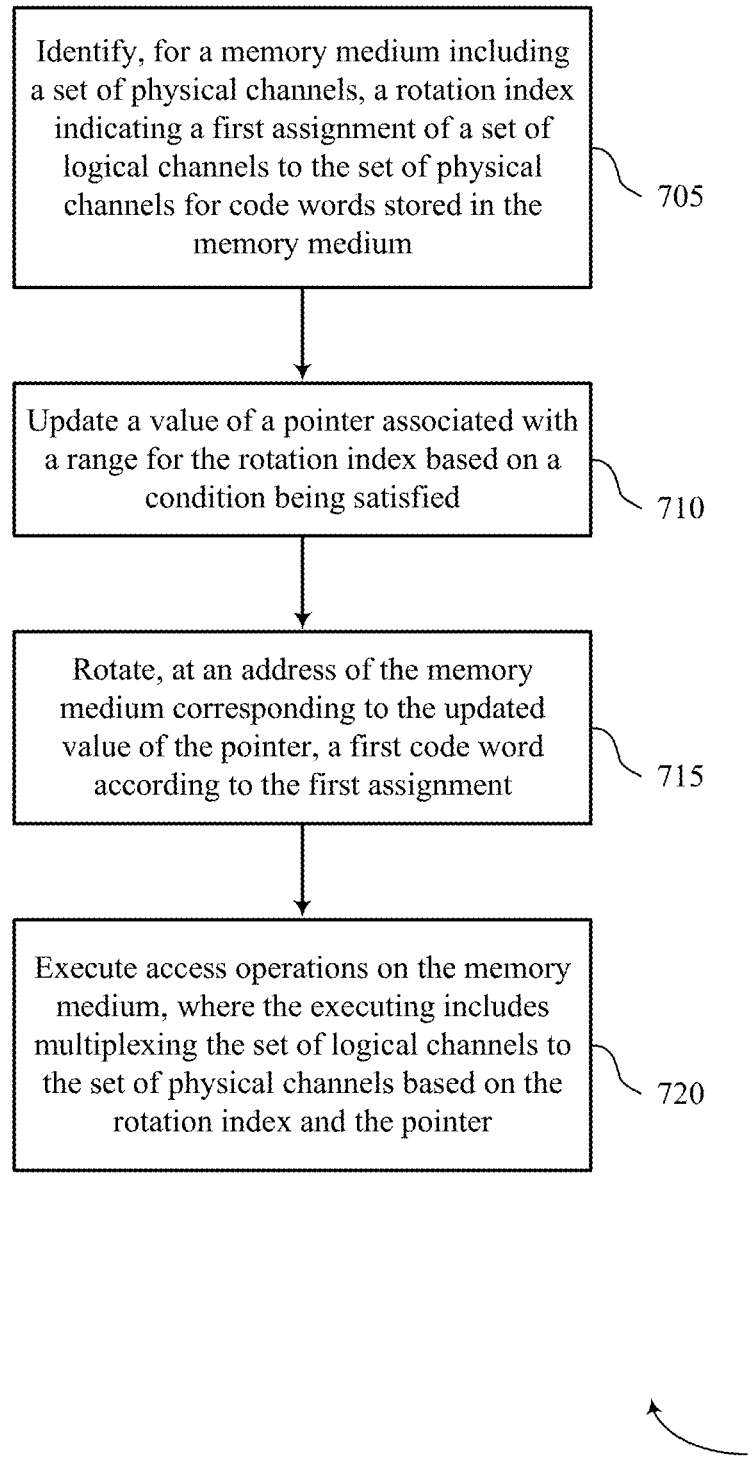
FIGS. 7 through 8 show flowcharts illustrating a method or methods that support intra-code word wear leveling techniques in accordance with examples as disclosed herein.

FIG. 7 shows a flowchart illustrating a method or methods 700 that supports intra-code word wear leveling techniques in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may identify, for a memory medium including a set of physical channels, a rotation index indicating a first assignment of a set of logical channels to the set of physical channels for code words stored in the memory medium. The operations of 705 may be performed according to the methods described herein. In some examples, aspects of the operations of 705 may be performed by a channel rotation manager as described with reference to FIG. 6.

At 710, the memory device may update a value of a pointer associated with a range for the rotation index based on a condition being satisfied. The operations of 710 may be performed according to the methods described herein. In some examples, aspects of the operations of 710 may be performed by a pointer manager as described with reference to FIG. 5.

At 715, the memory device may rearrange (e.g., rotate), at an address of the memory medium corresponding to the updated value of the pointer, a first code word according to the first assignment. The operations of 715 may be performed according to the methods described herein. In some examples, aspects of the operations of 715 may be performed by a channel rotation manager as described with reference to FIG. 6.

At 720, the memory device may execute access operations on the memory medium, where the executing includes multiplexing the set of logical channels to the set of physical channels based on the rotation index and the pointer. The operations of 720 may be performed according to the methods described herein. In some examples, aspects of the operations of 720 may be performed by a memory access manager as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for identifying, for a memory medium including a set of physical channels, a rotation index indicating a first assignment of a set of logical channels to the set of physical channels for code words stored in the memory medium, updating a value of a pointer associated with a range for the rotation index based on a condition being satisfied, rotating, at an address of the memory medium corresponding to the updated value of the pointer, a first code word according to the first assignment, and executing access operations on the memory medium, where the executing includes multiplexing the set of logical channels to the set of physical channels based on the rotation index and the pointer.

In some examples of the method 700 and the apparatus described herein, rotating the first code word may include operations, features, means, or instructions for reading fields of the first code word from the address of the memory medium corresponding to the updated value of the pointer according to an initial assignment of the set of logical channels to the set of physical channels, and writing the fields of the first code word to the address of the memory medium corresponding to the updated value of the pointer according to the first assignment of the set of logical channels to the set of physical channels.

In some examples of the method 700 and the apparatus described herein, the rotation index includes one of a set of index identifiers that may be each associated with a different assignment of the set of logical channels to the set of physical channels.

In some examples of the method 700 and the apparatus described herein, executing the access operations may include operations, features, means, or instructions for multiplexing the set of logical channels to the set of physical channels according to the first assignment of the set of logical channels to the set of physical channels for addresses of the access operations that may be earlier in an address order than the updated value of the pointer.

In some examples of the method 700 and the apparatus described herein, executing the access operations may include operations, features, means, or instructions for multiplexing the set of logical channels to the set of physical channels according to an initial assignment of the set of logical channels to the set of physical channels for addresses of the access operations that may be equal to or later than the updated value of the pointer in an address order.

Some examples of the method 700 and the apparatus described herein may further include operations, features, means, or instructions for identifying, based on the access operations, an idle period for the memory medium, where rotating the first code word of the memory medium occurs during the idle period. Additionally or alternatively, rotating the first code word of the memory medium may occur during a time period inserted between access operations (e.g., upon the trigger, if a certain period of time passes after the trigger without an idle period).

In some examples of the method 700 and the apparatus described herein, the condition may be based on a rotation frequency for the memory medium, completing the rotating, or both.

In some examples of the method 700 and the apparatus described herein, rotating the first code word of the memory medium may include operations, features, means, or instructions for maintaining an association of the set of physical channels to the set of logical channels for a field of the first code word.

In some examples of the method 700 and the apparatus described herein, the field of the first code word includes a same quantity of bits for each of the set of logical channels.

Some examples of the method 700 and the apparatus described herein may further include operations, features, means, or instructions for updating the rotation index based on performing the rotating for each address of the memory medium, the updated rotation index indicating a second assignment of the set of logical channels to the set of physical channels for the code words stored in the memory medium.

Some examples of the method 700 and the apparatus described herein may further include operations, features, means, or instructions for updating a value of the pointer for the updated rotation index based on the condition being satisfied, and performing a second data manipulation on a second address of the memory medium corresponding to the updated value of the pointer to rotate a second code word according to the second assignment of the set of logical channels to the set of physical channels.

Figure 8:
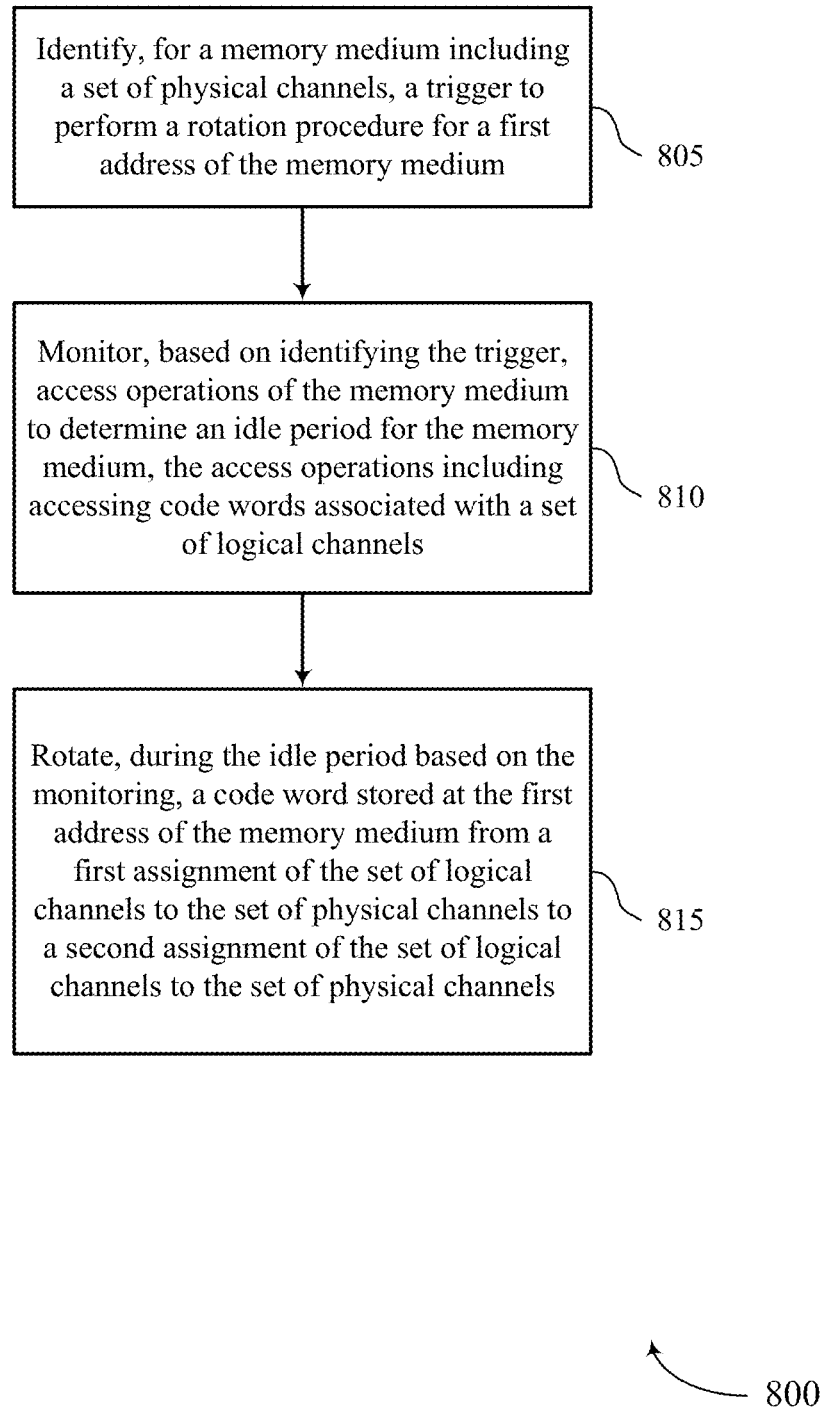

FIG. 8 shows a flowchart illustrating a method or methods 800 that supports intra-code word wear leveling techniques in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may identify, for a memory medium including a set of physical channels, a trigger to perform a rotation procedure for a first address of the memory medium. The operations of 805 may be performed according to the methods described herein. In some examples, aspects of the operations of 805 may be performed by a channel rotation manager as described with reference to FIG. 6.

At 810, the memory device may monitor, based on identifying the trigger, access operations of the memory medium to determine an idle period for the memory medium, the access operations including accessing code words associated with a set of logical channels. The operations of 810 may be performed according to the methods described herein. In some examples, aspects of the operations of 810 may be performed by a memory access manager as described with reference to FIG. 6.

At 815, the memory device may rearrange (e.g., rotate), during the idle period or during a time period inserted between access operations, a code word stored at the first address of the memory medium from a first assignment of the set of logical channels to the set of physical channels to a second assignment of the set of logical channels to the set of physical channels. The operations of 815 may be performed according to the methods described herein. In some examples, aspects of the operations of 815 may be performed by a channel rotation manager as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for identifying, for a memory medium including a set of physical channels, a trigger to perform a rotation procedure for a first address of the memory medium, monitoring, based on identifying the trigger, access operations of the memory medium to determine an idle period for the memory medium, the access operations including accessing code words associated with a set of logical channels, and rotating, during the idle period or during a time period inserted between access operations, a code word stored at the first address of the memory medium from a first assignment of the set of logical channels to the set of physical channels to a second assignment of the set of logical channels to the set of physical channels.

In some examples of the method 800 and the apparatus described herein, identifying the trigger to perform the rotating the code word may include operations, features, means, or instructions for determining an expiration of a timer associated with the rotating, and updating a value of a pointer to indicate the first address upon the expiration of the timer.

Some examples of the method 800 and the apparatus described herein may further include operations, features, means, or instructions for receiving, after performing the rotating, a first command to perform a first access operation at a second address of the memory medium, the second address being earlier in an address order than the first address, and executing the first access operation at the second address of the memory medium, where the executing the first access operation includes assigning the set of logical channels to the set of physical channels based on the second assignment.

Some examples of the method 800 and the apparatus described herein may further include operations, features, means, or instructions for receiving, after performing the rotating, a second command to perform a second access operation at a third address of the memory medium, the third address equal to or greater than the first address in the address order, and executing the second access operation at the third address of the memory medium, where the executing the second access operation includes assigning the set of logical channels to the set of physical channels based on the first assignment.

It should be noted that the methods described herein describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory media 130, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the herein description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope disclosed herein. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can include RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    updating, for a memory medium comprising a plurality of physical channels, a value of a pointer associated with a range for a mapping index based at least in part on a condition being satisfied, the mapping index indicating an assignment of a plurality of logical channels to the plurality of physical channels for code words stored in the memory medium;

mapping, at an address of the memory medium corresponding to the updated value of the pointer, a code word according to the assignment; and executing access operations on the memory medium, comprising multiplexing the plurality of logical channels to the plurality of physical channels based at least in part on the mapping index and the pointer.

2. The method of claim 1, wherein mapping the code word comprises:
reading fields of the code word from the address of the memory medium corresponding to the updated value of the pointer according to an initial assignment of the plurality of logical channels to the plurality of physical channels; and
writing the fields of the code word to the address of the memory medium corresponding to the updated value of the pointer according to the assignment of the plurality of logical channels to the plurality of physical channels.

3. The method of claim 1, wherein the mapping index comprises one of a plurality of index identifiers that are each associated with a different assignment of the plurality of logical channels to the plurality of physical channels.

4. The method of claim 1, wherein executing the access operations comprises:
multiplexing the plurality of logical channels to the plurality of physical channels according to the assignment of the plurality of logical channels to the plurality of physical channels for addresses of the access operations that are equal to or earlier in an address order than the updated value of the pointer.

5. The method of claim 1, wherein executing the access operations comprises:
multiplexing the plurality of logical channels to the plurality of physical channels according to an initial assignment of the plurality of logical channels to the plurality of physical channels for addresses of the access operations that are later than the updated value of the pointer in an address order.

6. The method of claim 1, further comprising:
identifying, based at least in part on the access operations, an idle period for the memory medium, wherein mapping the code word occurs during the idle period.

7. The method of claim 1, wherein the condition is based at least in part on a mapping frequency for the memory medium, completing the mapping of the code word, or both.

8. The method of claim 1, wherein:
mapping the code word comprises maintaining an association of the plurality of physical channels to the plurality of logical channels for a field of the code word.

9. The method of claim 8, wherein the field of the code word comprises a same quantity of bits for each of the plurality of logical channels.

10. The method of claim 1, further comprising:
updating the mapping index based at least in part on performing the mapping, the updated mapping index indicating a second assignment of the plurality of logical channels to the plurality of physical channels for the code words stored in the memory medium.

11. The method of claim 10, further comprising:
updating a value of the pointer for the updated mapping index based at least in part on the condition being satisfied; and
performing a data manipulation on a second address of the memory medium corresponding to the updated value of the pointer to map a second code word according to the second assignment.

12. A device, comprising:
a memory medium comprising a plurality of physical channels;
a memory interface coupled with the memory medium and operable to receive commands from a host device; and
circuitry coupled with the memory medium and the memory interface and operable to:
update, for the memory medium, a value of a pointer associated with a range for a mapping index based at least in part on a condition being satisfied, the mapping index indicating an assignment of a plurality of logical channels to the plurality of physical channels for code words stored in the memory medium;
map, at an address of the memory medium corresponding to the updated value of the pointer, a code word according to the assignment; and
execute access operations on the memory medium, comprising multiplexing the plurality of logical channels to the plurality of physical channels based at least in part on the mapping index and the pointer.

13. The device of claim 12, wherein the circuitry is further operable to:
execute an access operation at the address of the memory medium, comprising assigning the plurality of logical channels to the plurality of physical channels according to the assignment based at least in part on a correspondence between the address and the updated value of the pointer.

14. The device of claim 13, wherein the circuitry is further operable to:
execute a second access operation at a second address of the memory medium, comprising assigning the plurality of logical channels to the plurality of physical channels according to a second assignment based at least in part on a second correspondence between the second address and the updated value of the pointer.

15. The device of claim 12, wherein the circuitry is further operable to:
update the mapping index based at least in part on performing the mapping of the code word.

16. The device of claim 12, wherein the memory medium stores a plurality of code words, each of the plurality of code words comprising a first field associated with a first rate of change and a second field associated with a second rate of change.

17. A method, comprising:
identifying, for a memory medium comprising a plurality of physical channels, a trigger to perform a mapping procedure for an address of the memory medium;
monitoring, based at least in part on identifying the trigger, access operations of the memory medium to determine an idle period for the memory medium, the access operations comprising accessing code words associated with a plurality of logical channels; and
mapping, during the idle period based at least in part on the monitoring, a code word stored at the address of the memory medium from a first assignment of the plurality of logical channels to the plurality of physical channels to a second assignment of the plurality of logical channels to the plurality of physical channels.

18. The method of claim 17, wherein identifying the trigger to perform the mapping of the code word comprises:
determining an expiration of a timer associated with the mapping; and
updating a value of a pointer to indicate the address of the memory medium upon the expiration of the timer.

19. The method of claim 17, further comprising:
receiving, after performing the mapping, a command to perform an access operation at a second address of the memory medium, the second address being earlier in an address order than the address; and
executing the access operation at the second address of the memory medium, comprising assigning the plurality of logical channels to the plurality of physical channels based at least in part on the second assignment.

20. The method of claim 19, further comprising:
receiving, after performing the mapping, a second command to perform a second access operation at a third address of the memory medium, the third address equal to or greater than the address in the address order; and
executing the second access operation at the third address of the memory medium, comprising assigning the plurality of logical channels to the plurality of physical channels based at least in part on the first assignment.

* * * * *